United States Patent
Sakhare (10) Patent No.: US 11,087,799 B1
(45) Date of Patent: Aug. 10, 2021

(54) MAGNETIC RANDOM ACCESS MEMORY REFERENCE VOLTAGE GENERATION

(71) Applicant: QUALCOMM Incorporated, San Diego, CA (US)

(72) Inventor: Sushil Sudam Sakhare, Cork (IE)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/996,675

(22) Filed: Aug. 18, 2020

(51) Int. Cl.
*G11C 11/00* (2006.01)
*G11C 5/14* (2006.01)
*G11C 11/16* (2006.01)

(52) U.S. Cl.
CPC .......... *G11C 5/147* (2013.01); *G11C 11/1673* (2013.01); *G11C 11/1675* (2013.01); *G11C 11/1697* (2013.01)

(58) Field of Classification Search
CPC ..................................................... G11C 5/147
USPC ............................................. 365/158, 210.14
See application file for complete search history.

(56) References Cited

U.S. PATENT DOCUMENTS

| 8,576,617 | B2 | 11/2013 | Zhu et al. | |
|---|---|---|---|---|
| 2006/0092689 | A1* | 5/2006 | Braun | G11C 7/14 365/158 |

OTHER PUBLICATIONS

Dong Q., et al., "A 1Mb 28nm STT-MRAM with 2.8ns Read Access Time at 1.2V VDD Using Single-Cap Offset-Cancelled Sense Amplifier and In-situ Self-Write-Termination", ISSCC 2018, Feb. 14, 2018, 3 Pages.
Kim J.P., et al., "A 45nm 1Mb Embedded STT-MRAM with Design Techniques to Minimize Read-Disturbance," 2011 Symposium on VLSI Circuits Digest of Technical Papers, Jun. 2011, pp. 296-297.
Wang Y., et al., "Compact Model of Dielectric Breakdown in Spin-Transfer Torque Magnetic Tunnel Junction", IEEE Transactions on Electron Devices, vol. 63, No. 4, Apr. 2016, pp. 1762-1767.
Wei L., et al., "A 7Mb STT-MRAM in 22FFL FinFET Technology with 4ns Read Sensing Time at 0.9V Using Write-Verify-Write Scheme and Offset-Cancellation Sensing Technique", ISSCC 2019, Session 13, Feb. 19, 2019, 3 Pages.

* cited by examiner

*Primary Examiner* — Hoai V Ho
(74) *Attorney, Agent, or Firm* — MG-IP Law, P.C.

(57) ABSTRACT

MRAM reference voltage generation is disclosed. In one aspect, a reference circuit for generating a reference level includes first and second non-overlapping paths from a first node to a second node, each path having a precision resistor in series with a set of two or more magnetic MRAM elements electrically connected in parallel. The first set of two or more MRAM elements are in a parallel state and the second set of two or more MRAM elements are in an anti-parallel state, or a first portion of the first and second sets of two or more MRAM elements are in a parallel state and a second portion of the first and second sets of two or more MRAM elements are in an anti-parallel state. A measurement circuit receives a first value indicative of a resistance between the first node and the second node and outputs a reference level based at least in part on the first value.

20 Claims, 8 Drawing Sheets

MAGNETIC RANDOM ACCESS MEMORY REFERENCE VOLTAGE GENERATION

FIELD OF DISCLOSURE

This disclosure relates generally to magnetic random access memory (MRAM), and more specifically, but not exclusively, to reference voltage generation for same and fabrication techniques thereof.

BACKGROUND

Magnetic random access memory (MRAM) is a memory which uses magnetic tunnel junctions (MTJs) as memory cells. A typical MTJ has three layers: a fixed layer, which has a fixed magnetic orientation; a free layer, which has a changeable magnetic orientation; and a spacer layer that separates the fixed layer from the free layer. For the purposes of illustration, the layers are considered to be stacked vertically. The write operation changes the magnetic orientation of the free layer. When the magnetic orientation of the free layer is parallel to the magnetic orientation of the fixed layer, the MTJ is in a low resistance state having a resistance Rparallel (Rp), and when the magnetic orientation of free layer is opposite or anti-parallel to the magnetic orientation of the fixed layer, the MTJ is in a high resistance state having a resistance Ranti-parallel (Rap). The resistance of the MTJ can be measured by applying a small read current thereto and measuring the voltage drop across the MTJ. Thus, an MTJ can be used as a memory element having one of two data values based on the two resistances Rp and Rap.

In a spin torque transfer (STT) MRAM (STT-MRAM), a write operation involves passing a current vertically through both the fixed layer and the free layer in order to program the free layer. In a voltage-controlled magnetic anisotropy (VCMA) MRAM (VCMA-MRAM or VC-MRAM), a write operation uses a voltage, rather than a current, to program the free layer. In a spin-orbit torque (SOT) MRAM (SOT-MRAM), a write operation involves passing a current horizontally through the SOT-metal (typically a thin sheet of heavy metal like tungsten) which is in contact with free layer, avoiding current through the MTJ stack.

Figure 1A:
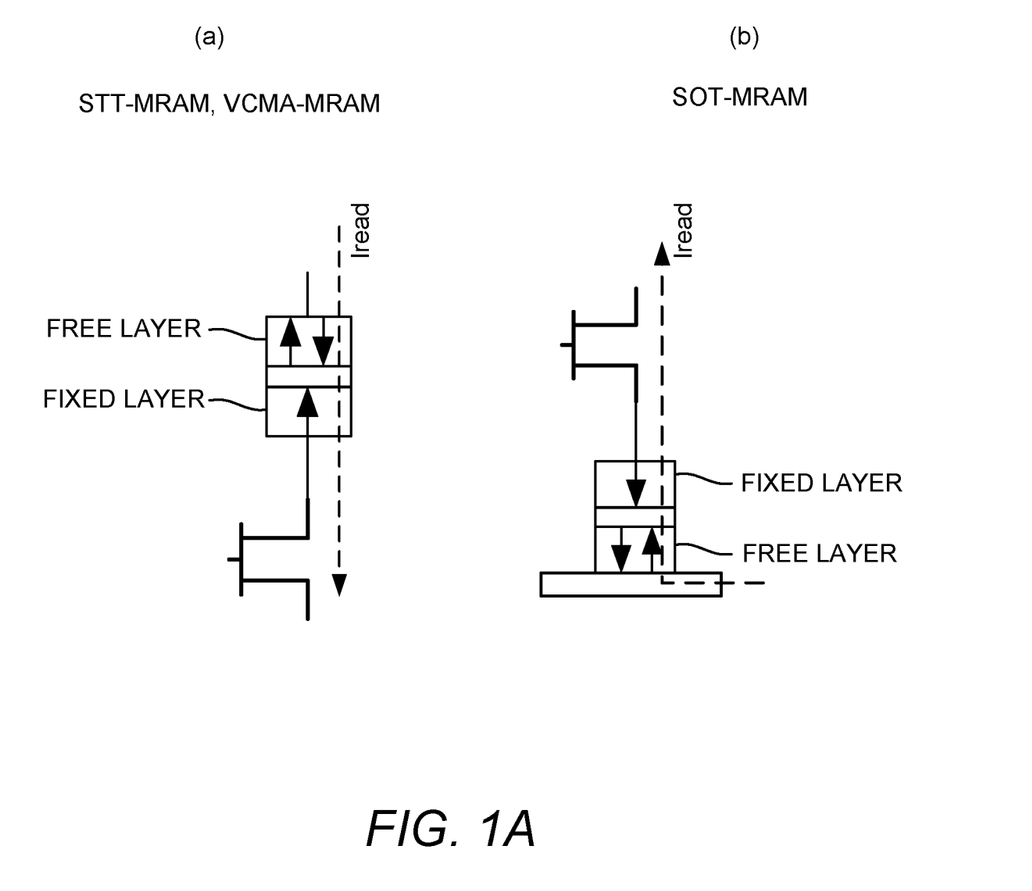
FIG. 1A compares the read operations of various types of magnetic random access memory (MRAM) cells.

FIG. 1A compares the read operations of various types of MRAM cells. FIG. 1A(a) shows the read current that occurs when reading an STT-MRAM or VCMA-MRAM cell, and FIG. 1A(b) shows the read current that occurs when reading a SOT-MRAM cell. Thus, each type of MRAM uses a different write technique, but all use the same read technique, i.e., passing a current though both the free layer and the fixed layer.

When reading an MRAM cell, a reference voltage is needed for comparison to determine whether the MTJ is in the Rp state or in the Rap state. Thus, in conventional MRAM arrays, each row of MTJ memory cells includes a reference cell that produces the necessary reference voltage. Since the reference voltage is ideally a voltage that is between the voltage produced by the cell in the Rp state and the voltage that is produced by the cell in the Rap state, a conventional reference cell uses a pair of MTJ cells—one MTJ cell in the Rp state and another MTJ cell in the Rap state—as an equivalent parallel resistor.

Figure 1B:
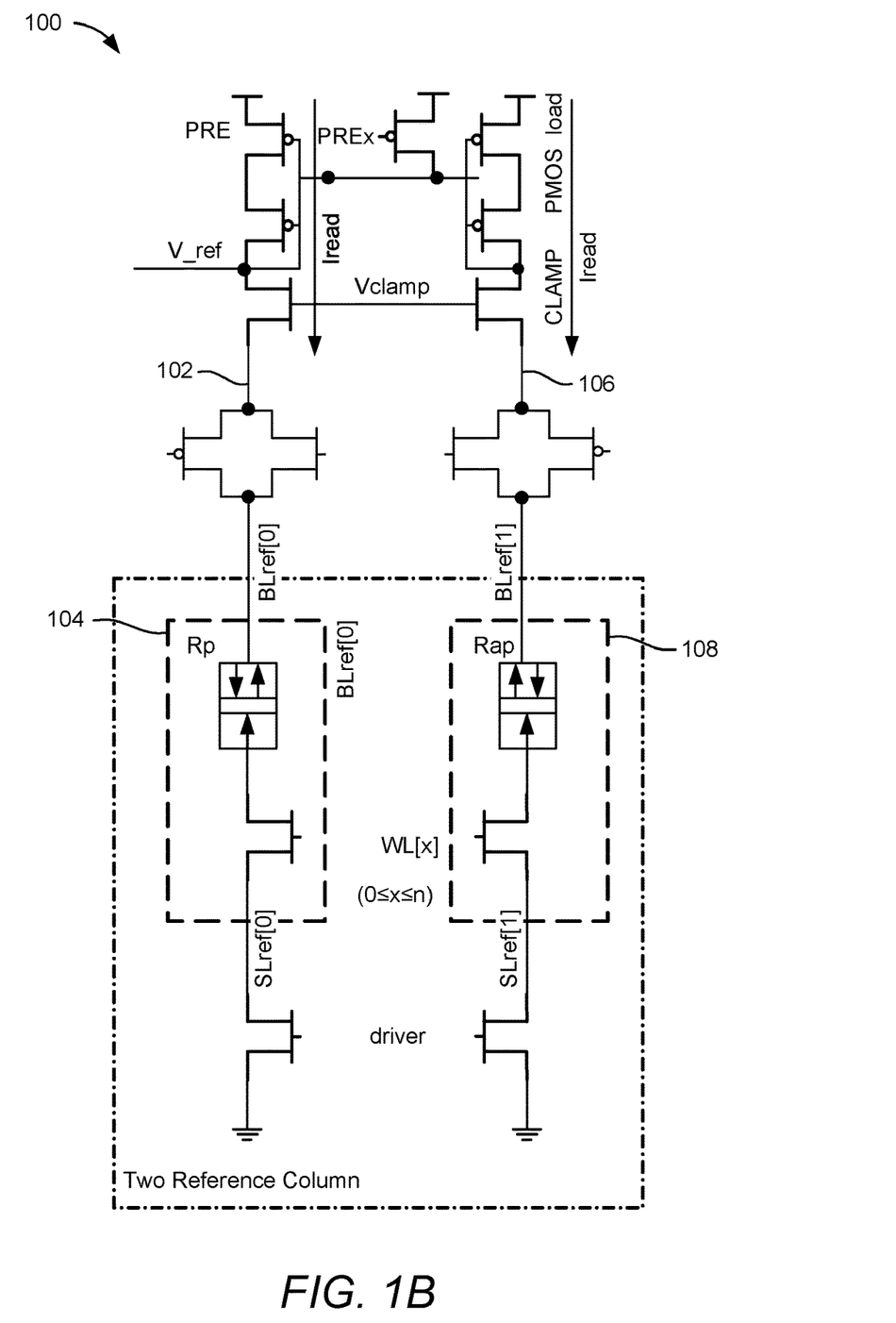
FIG. 1B shows a portion of a conventional MRAM.

FIG. 1B shows a portion 100 of a conventional STT-MRAM that uses this technique. In FIG. 1B, Vref is generated by a circuit having two paths, a left path 102 with an MTJ cell in the $R_P$ state 104 and a right path 106 with an MTJ cell in the Ry state 108. During the read operation, left path 102 and right path 106 each have a read current $I_{READ}$; since the resistance $R_P$ and the resistance $R_{AP}$ are different, the resulting Vref generated by portion 100 will correspond to a voltage that is proportional to $I_{READ}$ times a resistance that is between $R_P$ and $R_{AP}$. By using MTJs in the reference cell, variations in process, voltage, and temperature (PVT) will affect the reference cell and the MTJ memory cell equally, a phenomenon known as "PVT tracking."

Nevertheless, the values of Rp and Rap are very sensitive to PVT variations, and can vary from array to array across a die, from die to die across wafers, and from wafer to wafer across a wafer process. Thus, even in designs that use MTJs in the reference cell, the variability of MTJ devices can impair the performance of an STT-MRAM array.

Figure 2:
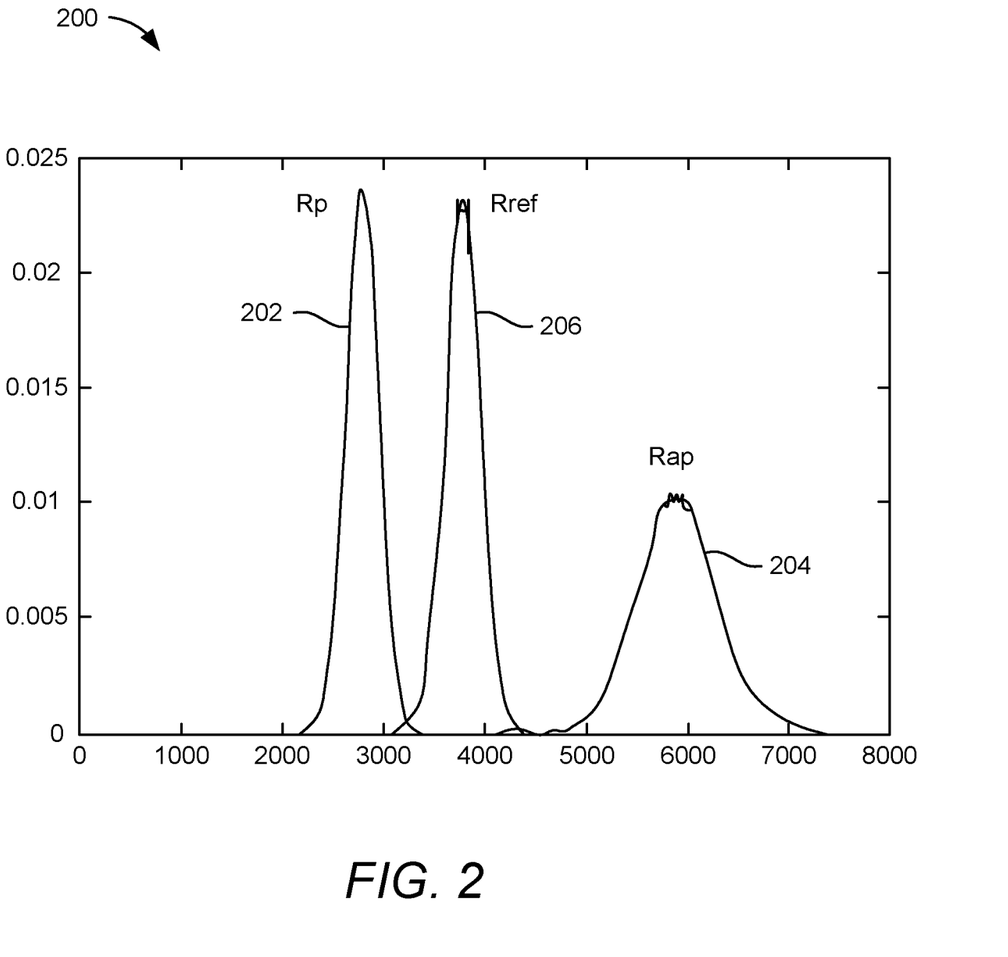
FIG. 2 is a plot showing the distribution of resistance values of parallel-state MTJs, anti-parallel-state MTJs, and reference cells using a parallel-state/anti-parallel-state MTJ pair.

FIG. 2 is a plot 200 that shows a first distribution 202 of resistances of a given group of MTJ's when they are in a magnetically parallel state and a second distribution 204 of this group of MTJ's when they are in a magnetically anti-parallel state. The first distribution 202 ranges from approximately 2000 ohms to 3500 ohms while the second distribution 204 ranges from approximately 4250 ohms to 7250 ohms. When a reference resistance is determined from such MTJ's in a conventional manner, that resistance may have a third distribution 206 from about 3000 ohms to 4250 ohms This third distribution 206 thus overlaps with at least the first distribution 202 and has little or no spacing from the second distribution 204. This lack of a clear separation between the resistance distributions may make it difficult to determine with confidence the magnetic state of a target MTJ. Moreover, the variability of the values of $R_p$ and $R_{ap}$ results in variable switching voltages, which leads to variable write times for STT-MRAM cells.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In accordance with the various aspects disclosed herein, at least one aspect includes a reference circuit for generating a reference level. The reference circuit includes first and second non-overlapping paths from a first node to a second node. The first path includes a first precision resistor electrically connected in series with a first set of two or more magnetic random access memory (MRAM) elements electrically connected in parallel. The second path includes a second precision resistor electrically connected in series with a second set of two or more MRAM elements electrically connected in parallel. The first set of two or more MRAM elements are in a parallel state and the second set of two or more MRAM elements are in an anti-parallel state, or a first portion of each of the first and second sets of two or more MRAM elements are in a parallel state and a second portion of each of the first and second sets of two or more MRAM elements are in an anti-parallel state. The reference circuit includes a measurement circuit configured to receive a first value indicative of a resistance between the first node and the second node and to output a reference level based at least in part on the first value.

In accordance with the various aspects disclosed herein, at least one aspect includes a method of generating a reference level. The method includes providing first and second non-overlapping paths from a first node to a second node. The first path includes a first precision resistor electrically connected in series with a first set of two or more magnetic random access memory (MRAM) elements electrically connected in parallel. The second path includes a second precision resistor electrically connected in series with a second set of two or more MRAM elements electrically connected in parallel. The first set of two or more MRAM elements are in a parallel state and the second set of two or more MRAM elements are in an anti-parallel state, or a first portion of each of the first and second sets of two or more MRAM elements are in a parallel state and a second portion of each of the first and second sets of two or more MRAM elements are in an anti-parallel state. The method includes providing a measurement circuit configured to receive a first value indicative of a resistance between the first node and the second node and to output a reference level based at least in part on the first value.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

When reading an MRAM cell, a reference voltage is needed for comparison to determine whether the MTJ is in the Rp state or in the Rap state. Thus, in conventional MRAM arrays, each row of MTJ memory cells includes a reference cell that produces the necessary reference voltage. Since the reference voltage is ideally a voltage that is between the voltage produced by the cell in the Rp state and the voltage that is produced by the cell in the Rap state, a conventional reference cell uses a pair of MTJ cells—one MTJ cell in the Rp state and another MTJ cell in the Rap state—as a parallel combination of resistor. By using MTJs in the reference cell, variations in process, voltage, and temperature (PVT) will affect the reference cell and the MTJ memory cell equally, a phenomenon known as "PVT tracking." Nevertheless, the values of Rp and Rap are very sensitive to PVT variations, and can vary from array to array across a die, from die to die across wafers, and from wafer to wafer across a wafer process. Thus, even in designs that use MTJs in the reference cell, the variability of MTJ devices can impair the performance of an MRAM array.

In one conventional approach to addressing the problem of uncertainty about the write time for any particular MRAM cell is to perform a "self-terminated" write cycle, in which the write continues until the circuit determines that the correct value has been successfully written into the MTJ. However, this approach requires the continual use of the read reference voltage produced by the reference cell, in order to determine when to self-terminate the write operation. Because the read reference voltage is continually being used, even during write cycles, the reference cell tends to overheat, which dramatically reduces the operational lifetimes of the MTJs within the reference cell.

Another conventional approach to addressing the problem of uncertainty about the write time for any particular MRAM cell is to use a precision resistor in place of pairs of parallel-state and anti-parallel-state MTJs. However, this approach also has disadvantages, such as the fact that the reference cell does not track with the MTJ memory cell over process, voltage, and time.

Figure 3:
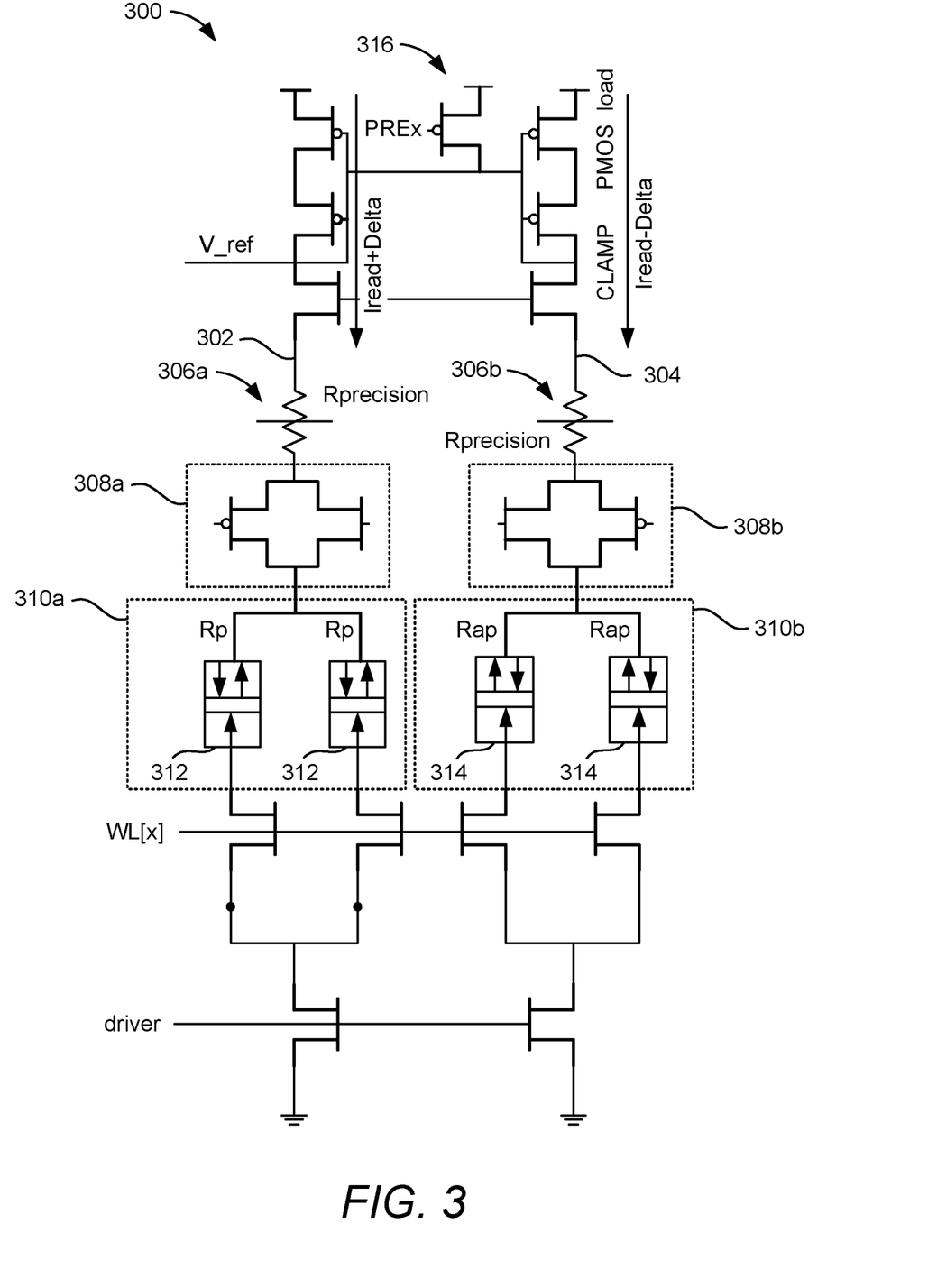
FIG. 3 illustrates a portion of an exemplary circuit for providing a reference level for an MRAM in accordance one or more aspects of the disclosure.

FIG. 3 illustrates an exemplary circuit 300 for providing a reference level for an MRAM in accordance one or more aspects of the disclosure. In FIG. 3, circuit 300 has two non-overlapping paths to ground. Each path has a precision resistor electrically connected in series with a set of two or more MTJs electrically connected in parallel. In FIG. 3, a first path 302 has a first precision resistor 306a electrically connected in series with a first multiplexer 308a and a first set 310a of parallel-state MTJs 312 electrically connected in parallel, while a second path 304 has a second precision resistor 306b electrically connected in series with a second multiplexer 308b and a second set 310b of anti-parallel-state MTJs 314 electrically connected in parallel. According to some aspects, the multiplexers may be omitted, and the precision resistors directly connected in series to the respective set of MTJs electrically connected in parallel. In circuit 300, during a read operation, the current in path 302 will be slightly larger than the current in path 304. These currents are shown in FIG. 3 as "$I_{READ}$+delta" and "$I_{READ}$−delta", respectively. Thus, this configuration is herein referred to as being asymmetrical. A measurement circuit 316 receives a first value indicative of a resistance between a first node and a second node, i.e., the resistance to ground through both paths, and outputs a reference level based at least in part on the first value. The reference level is then compared to a measured resistance of a target MRAM cell to determine the state of the target MRAM cell, e.g., using a comparator or comparator means.

Figure 4:
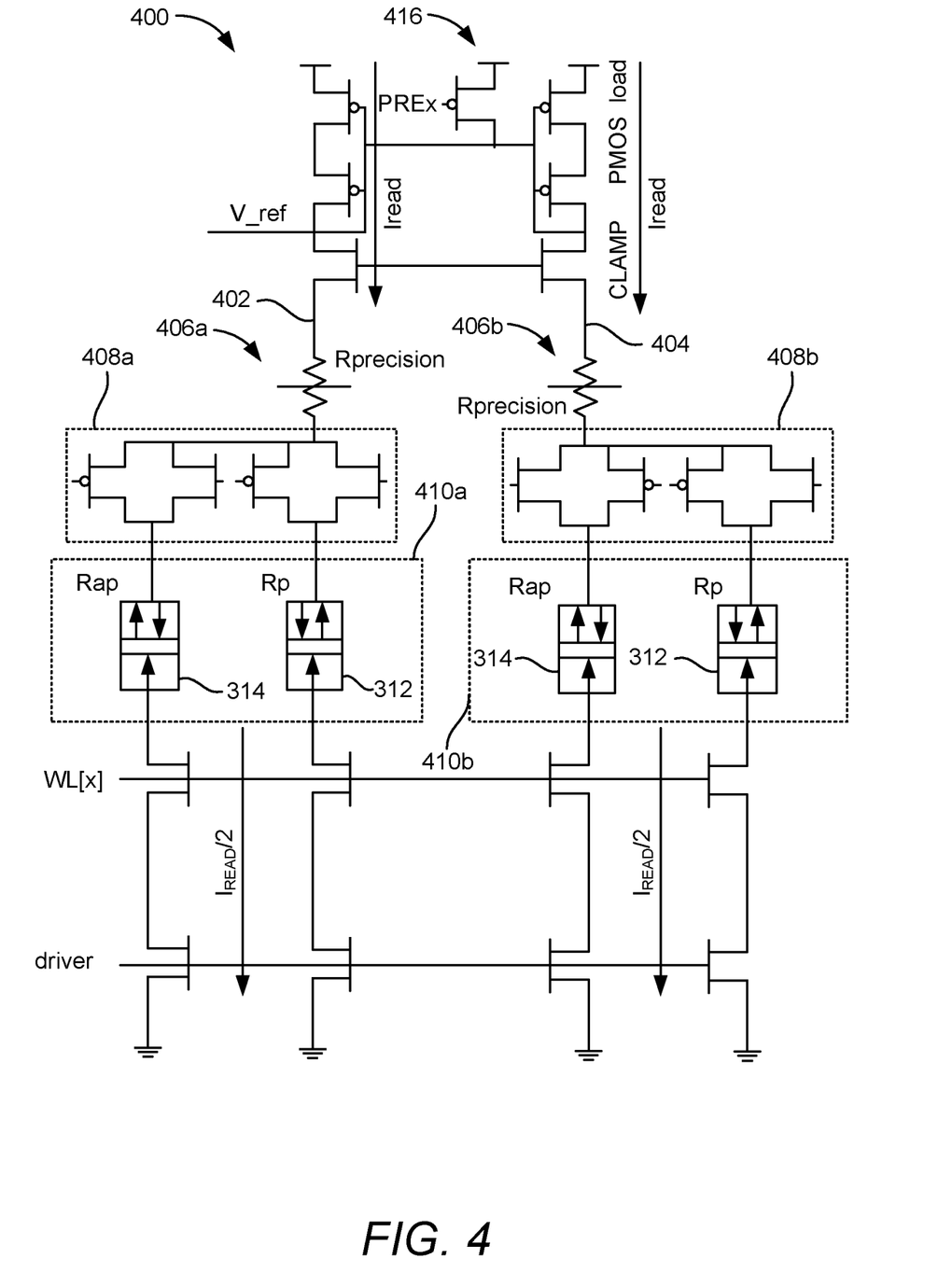
FIG. 4 illustrates a portion of another exemplary circuit for providing a reference level for an MRAM in accordance one or more aspects of the disclosure.

FIG. 4 illustrates an exemplary circuit 400 for providing a reference level for an MRAM in accordance one or more aspects of the disclosure. In FIG. 4, circuit 400 has two non-overlapping paths to ground. Each path has a precision resistor electrically connected in series with a set of two or more MTJs electrically connected in parallel. As used herein, the term "precision resistor" refers to resistor with a resistance tolerance of less than ±1%, such as, but not limited to, ±0.1%, ±0.5%, ±0.1%, and ±0.5%. The precision resistor may be a post-silicon tunable high-precision resistor. The precision resistor may be a single resistor or a resistor network. In some aspects, the precision resistor may be multiple resistors than can be electrically coupled using electronic switches to realize a desired resistance. In FIG. 4, a first path 402 has a first precision resistor 406a electrically connected in series with a first multiplexer 408a and a first set 410a of MTJs in parallel, while a second path 404 has a second precision resistor 406b electrically connected in series with a second multiplexer 408b and a second set 410b of MTJs in parallel. In FIG. 4, each of the first set 410a and the second set 410b of MTJs in parallel includes at least one parallel-state MTJ 312 and at least one anti-parallel-state MTJ 314. In circuit 400, during a read operation, the current in path 302 and path 304 will be the same. Thus, this configuration is herein referred to as being symmetrical. A measurement circuit 416 receives a first value indicative of a resistance between a first node and a second node, i.e., the resistance to ground through both paths, and outputs a reference level based at least in part on the first value. The reference level is then compared to a measured resistance of a target MRAM cell to determine the state of the target MRAM cell, e.g., using a comparator or comparator means.

In both circuit 300 and circuit 400, because each path has MTJ devices in parallel, the read current seen by each MTJ device in circuit 300 or circuit 400 is smaller than the read current that would be seen by each MTJ device in the circuit shown in FIG. 1, which avoids the overheating and MTJ degradation that is suffered by conventional MRAM voltage references. According to some aspects, each set of MTJs in parallel includes two MTJs in parallel, in which case each MTJ would receive half of the read current that would be seen by MTJs conventional circuits. According to some aspects, each set of MTJs in parallel includes N MTJs in parallel (where N>2), in which case each MTJ would receive approximately 1/N times the read current that would be seen by MTJs conventional circuits.

Figure 5:
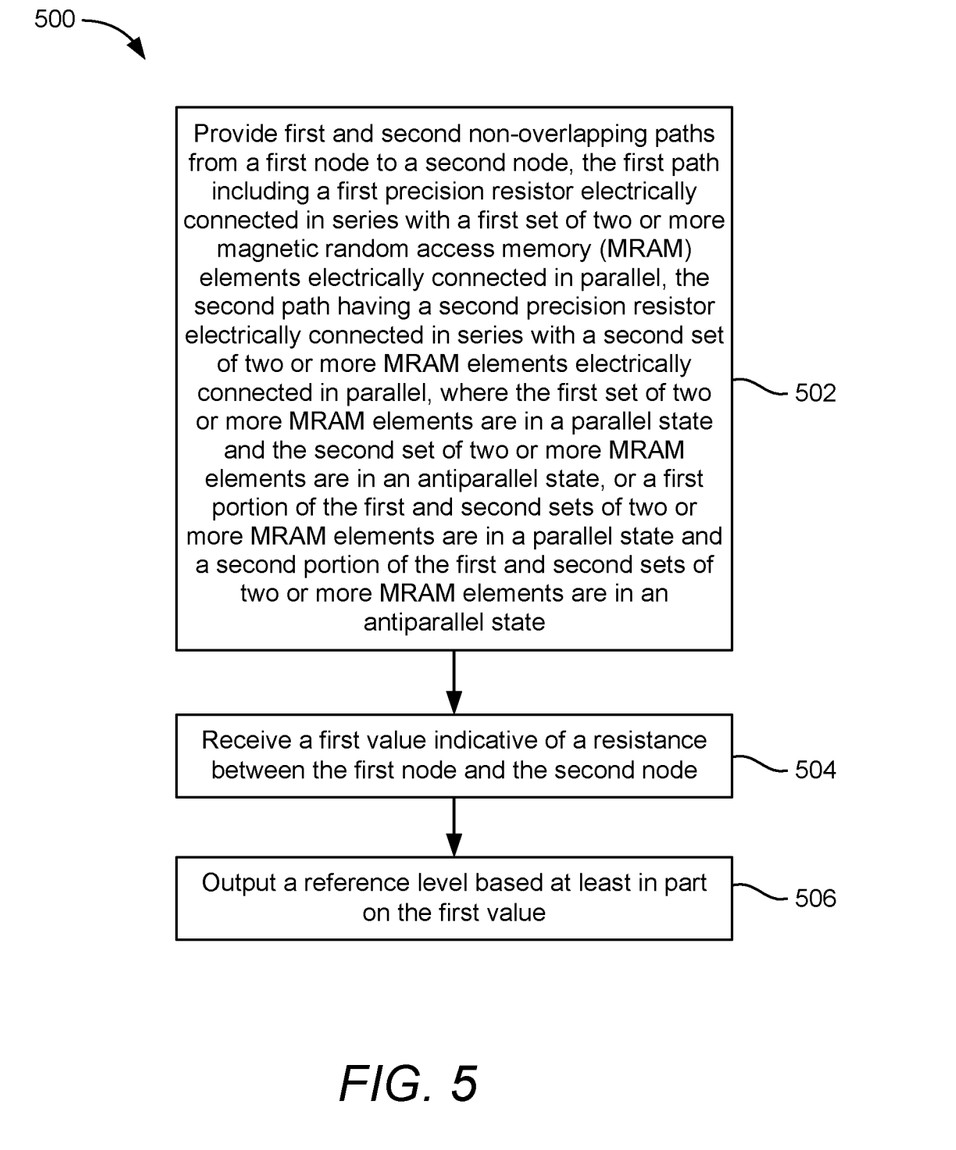
FIG. 5 illustrates a flow chart of an exemplary method of generating a reference level for an MRAM in accordance one or more aspects of the disclosure.

FIG. 5 illustrates a flow chart of an exemplary method of generating a reference level for an MRAM in accordance one or more aspects of the disclosure. As shown in FIG. 5, the method 500 may begin in block 502 with providing first and second non-overlapping paths from a first node to a second node, the first path having a first precision resistor electrically connected in series with a first set of two or more magnetic random access memory (MRAM) elements electrically connected in parallel, the second path having a second precision resistor electrically connected in series with a second set of two or more MRAM elements electrically connected in parallel. According to some aspects, the first set of two or more MRAM elements are in a parallel state and the second set of two or more MRAM elements are in an anti-parallel state. According to other aspects, a first portion of each of the first and second sets of two or more MRAM elements are in a parallel state and a second portion of each of the first and second sets of two or more MRAM elements are in an anti-parallel state. The method 500 may continue in block 504 with receiving a first value indicative of a resistance between the first node and the second node. The method 500 may continue in block 506 with outputting a reference level based at least in part on the first value. In some aspects, this may be accomplished by providing a measurement circuit configured to receive a first value indicative of a resistance between the first node and the second node and to output a reference level based at least in part on the first value.

The circuits illustrated in FIG. 3 and FIG. 4, and the method illustrated in FIG. 5, may be used in any MRAM which requires a reference voltage for a read operation, including, but not limited to, a spin torque transfer (STT) MRAM (STT-MRAM), a voltage-controlled magnetic anisotropy (VCMA) MRAM (VCMA-MRAM or VC-MRAM), and a spin-orbit torque (SOT) MRAM (SOT-MRAM).

Figure 6:
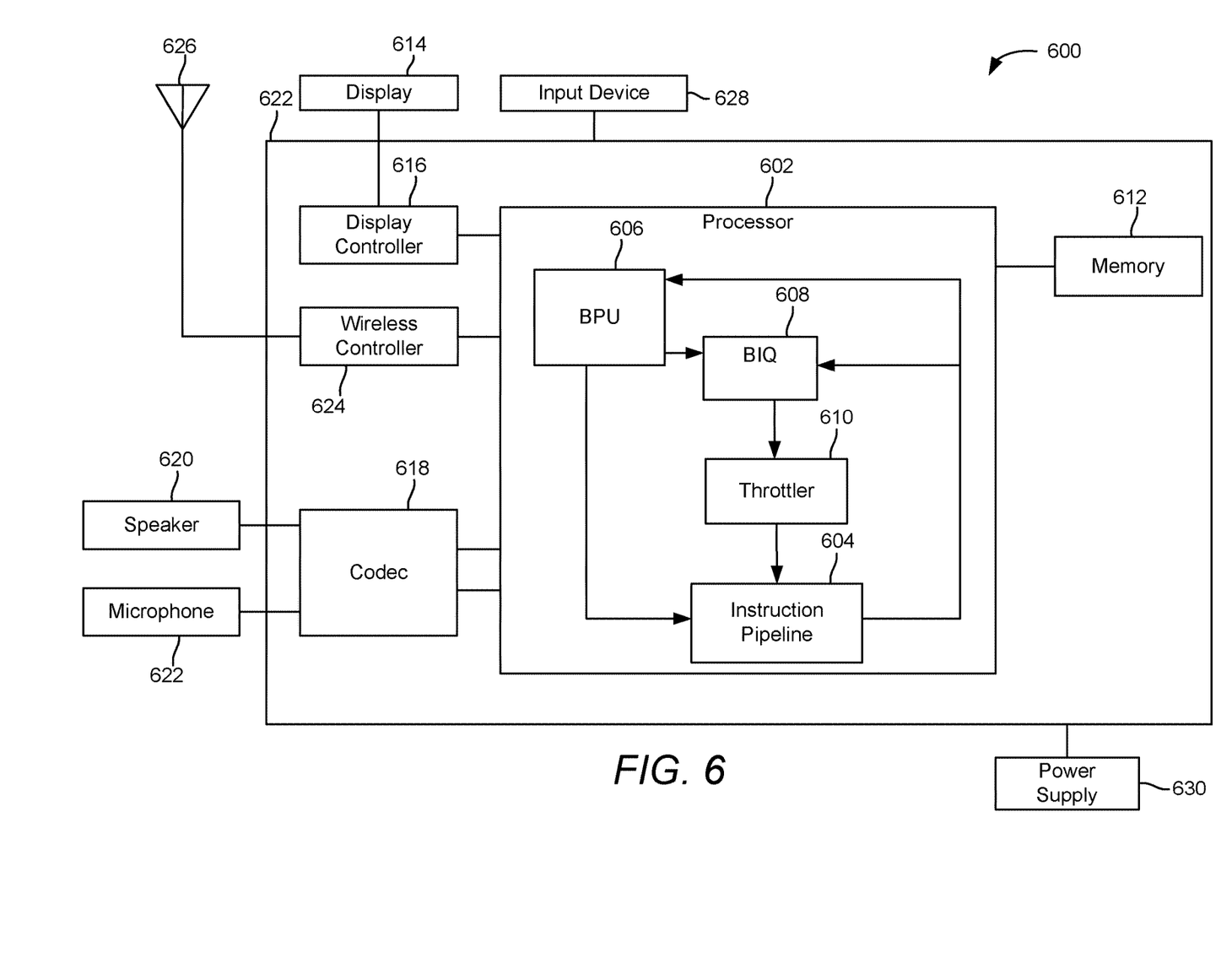
FIG. 6 illustrates an exemplary mobile device in accordance with one or more aspects of the disclosure.

FIG. 6 illustrates an exemplary mobile device in accordance with some examples of the disclosure. Referring now to FIG. 6, a block diagram of a mobile device that is configured according to exemplary aspects is depicted and generally designated mobile device 600. In some aspects, mobile device 600 may be configured as a wireless communication device. As shown, mobile device 600 includes processor 602. Processor 602 is shown to comprise instruction pipeline 604, buffer processing unit (BPU) 606, branch instruction queue (BIQ) 608, and throttler 610 as is well known in the art. Other well-known details (e.g., counters, entries, confidence fields, weighted sum, comparator, etc.) of these blocks have been omitted from this view of processor 602 for the sake of clarity. Processor 602 may be communicatively coupled to memory 612 over a link, which may be a die-to-die or chip-to-chip link. Mobile device 600 also includes display 614 and display controller 616, with display controller 616 coupled to processor 602 and to display 614.

In some aspects, FIG. 6 may include coder/decoder (CODEC) 618 (e.g., an audio and/or voice CODEC) coupled to processor 602; speaker 620 and microphone 622 coupled to CODEC 618; and wireless controller circuits 624 (which may include a modem, radio frequency (RF) circuitry, filters, etc., which may be implemented using one or more flip-chip devices, as disclosed herein) coupled to wireless antenna 626 and to processor 602.

In a particular aspect, where one or more of the above-mentioned blocks are present, processor 602, display controller 616, memory 612, CODEC 618, and wireless controller circuits 624 can be included in a system-in-package or system-on-chip device, including but not limited to package 402, which may be implemented in whole or part using the techniques disclosed herein. Input device 628 (e.g., physical or virtual keyboard), power supply 630 (e.g., battery), display 614, input device 628, speaker 620, microphone 622, wireless antenna 626, and power supply 630 may be external to system-on-chip device and may be coupled to a component of system-on-chip device, such as an interface or a controller.

It should be noted that although FIG. 6 depicts a mobile device, the processor 602 and memory 612 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 7:
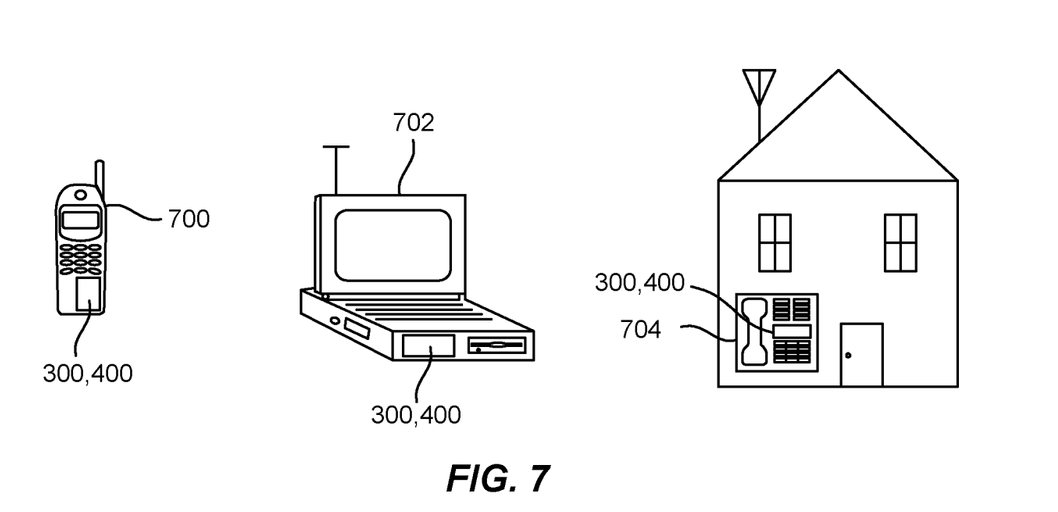
FIG. 7 illustrates various electronic devices that may be integrated with any of the aforementioned integrated device or semiconductor device in accordance with one or more aspects of the disclosure.

FIG. 7 illustrates various electronic devices that may be integrated with any of the aforementioned integrated device or semiconductor device accordance with various examples of the disclosure. For example, a mobile phone device 700, a laptop computer device 702, and a fixed location terminal device 704 may each be considered generally user equipment (UE) and may include a circuit 300 or 400 as described herein, for example. The mobile phone device 700, laptop computer device 702, and fixed location terminal device 704 illustrated in FIG. 7 are merely exemplary. Other electronic devices may also feature device including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into a flip-chip package. The flip-chip packages may then be employed in devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 3-7 may be rearranged and/or combined into a single component, process, feature or function or incorporated in several components, processes, or functions. Additional elements, components, processes, and/or functions may also be added without departing from the disclosure. It should also be noted that FIGS. 3-7 and corresponding description in the present disclosure are not limited to dies and/or ICs. In some implementations, FIGS. 3-7 and their corresponding descriptions may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), Third Generation Partnership Project (3GPP) Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A reference circuit for generating a reference level, the reference circuit comprising:
    first and second non-overlapping paths from a first node to a second node, the first path comprising a first precision resistor electrically connected in series with a first set of two or more magnetic random access memory (MRAM) elements electrically connected in parallel, the second path comprising a second precision resistor electrically connected in series with a second set of two or more MRAM elements electrically connected in parallel, wherein:
        the first set of two or more MRAM elements are in a parallel state and the second set of two or more MRAM elements are in an anti-parallel state; or
        a first portion of each of the first and second sets of two or more MRAM elements are in a parallel state and a second portion of each of the first and second sets of two or more MRAM elements are in an anti-parallel state; and
    a measurement circuit configured to receive a first value indicative of a resistance between the first node and the second node and to output a reference level based at least in part on the first value.

2. The reference circuit of claim 1, further comprising a comparator configured to receive the reference level at a first input and a signal related to a measured resistance of a target MRAM cell at a second input.

3. The reference circuit of claim 1, wherein the MRAM elements comprise magnetic tunnel junctions (MTJs) having a parallel state and an anti-parallel state.

4. The reference circuit of claim 3, wherein the MTJs comprise spin torque transfer (STT) MTJs.

5. The reference circuit of claim 3, wherein the MTJs comprise voltage-controlled magnetic anisotropy (VCMA) MTJs.

6. The reference circuit of claim 3, wherein the MTJs comprise spin-orbit torque (SOT) MTJs.

7. The reference circuit of claim 1, wherein each of the first and second sets of two or more MRAM elements comprises two MRAM elements electrically connected in parallel.

8. The reference circuit of claim 1, wherein each of the first and second sets of two or more MRAM elements comprises more than two MRAM elements electrically connected in parallel.

9. The reference circuit of claim 1, wherein the first and second paths are electrically parallel.

10. The reference circuit of claim 1 integrated in at least one semiconductor die.

11. The reference circuit of claim 1 integrated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

12. A method of generating a reference level, the method comprising:
    providing first and second non-overlapping paths from a first node to a second node, the first path comprising a first precision resistor electrically connected in series with a first set of two or more magnetic random access memory (MRAM) elements electrically connected in parallel, the second path comprising a second precision resistor electrically connected in series with a second set of two or more MRAM elements electrically connected in parallel, wherein:
        the first set of two or more MRAM elements are in a parallel state and the second set of two or more MRAM elements are in an anti-parallel state; or
        a first portion of each of the first and second sets of two or more MRAM elements are in a parallel state and a second portion of each of the first and second sets of two or more MRAM elements are in an anti-parallel state; and
    providing a measurement circuit configured to receive a first value indicative of a resistance between the first node and the second node and to output a reference level based at least in part on the first value.

13. The method of claim 12, further comprising comparing the reference level to a measured resistance of a target MRAM cell.

14. The method of claim 12, wherein the MRAM elements comprise magnetic tunnel junctions (MTJs) having a parallel state and an anti-parallel state.

15. The method of claim 14, wherein the MTJs comprise spin torque transfer (STT) MTJs.

16. The method of claim 14, wherein the MTJs comprise voltage-controlled magnetic anisotropy (VCMA) MTJs.

17. The method of claim 14, wherein the MTJs comprise spin-orbit torque (SOT) MTJs.

18. The method of claim 12, wherein each of the first and second sets of two or more MRAM elements comprises two MRAM elements electrically connected in parallel.

19. The method of claim 12, wherein each of the first and second sets of two or more MRAM elements comprises more than two MRAM elements electrically connected in parallel.

20. The method of claim 12, wherein the first and second paths are electrically parallel.

* * * * *